United States Patent
Prest

(10) Patent No.: US 9,107,298 B2
(45) Date of Patent: Aug. 11, 2015

(54) VISCOELASTIC MATERIAL FOR SHOCK PROTECTION IN AN ELECTRONIC DEVICE

(75) Inventor: Christopher Prest, Mountain View, CA (US)

(73) Assignee: APPLE INC., Cupertino, CA (US)

(*) Notice: Subject to any disclaimer, the term of this patent is extended or adjusted under 35 U.S.C. 154(b) by 309 days.

(21) Appl. No.: 13/591,196

(22) Filed: Aug. 21, 2012

(65) Prior Publication Data

US 2013/0077278 A1 Mar. 28, 2013

Related U.S. Application Data

(63) Continuation of application No. 12/242,907, filed on Sep. 30, 2008, now Pat. No. 8,248,777.

(60) Provisional application No. 61/128,669, filed on May 23, 2008.

(51) Int. Cl.
  *G06F 1/16* (2006.01)
  *H05K 5/02* (2006.01)
  *G11B 33/08* (2006.01)

(52) U.S. Cl.
  CPC ............... *H05K 5/0217* (2013.01); *G11B 33/08* (2013.01); *Y10T 29/49002* (2015.01)

(58) Field of Classification Search
  CPC ............ B32B 2307/50; B32B 2307/51; B32B 2307/56; A41D 31/0044; A41D 31/005; H01R 13/562; H01R 13/565
  USPC ..................................................... 361/679.36
  See application file for complete search history.

(56) References Cited

U.S. PATENT DOCUMENTS

| | | | |
|---|---|---|---|
| 3,606,296 A | | 9/1971 | Chassagne |
| 4,278,726 A | * | 7/1981 | Wieme ...................... 428/300.7 |
| 4,849,580 A | | 7/1989 | Reuter |
| 5,182,158 A | | 1/1993 | Schaeffer |
| 5,349,893 A | | 9/1994 | Dunn |
| 5,368,914 A | * | 11/1994 | Barrett ........................ 428/201 |
| 5,426,562 A | | 6/1995 | Morehouse et al. |
| 5,587,854 A | | 12/1996 | Sato et al. |
| 5,606,341 A | | 2/1997 | Aguilera |
| 5,659,376 A | | 8/1997 | Uehara et al. |
| 5,666,261 A | | 9/1997 | Aguilera |
| 5,735,707 A | * | 4/1998 | O'Groske et al. ............ 439/446 |

(Continued)

FOREIGN PATENT DOCUMENTS

| | | |
|---|---|---|
| CN | 202444711 | 9/2012 |
| CN | 203119975 | 8/2013 |

(Continued)

*Primary Examiner* — Anthony Q Edwards
(74) *Attorney, Agent, or Firm* — Brownstein Hyatt Farber Schreck, LLP

(57) ABSTRACT

This invention is directed to reducing the effect of shocks on electronic device components. The electronic device component may be surrounded by a boundary element operative to deform in response to impacts. By deforming, the boundary element may be operative to absorb energy received by the shock or impact without passing the energy on to the electronic device component. To maximize the effectiveness of the boundary element over a range of different impacts (e.g., strong, instantaneous impacts and weak impacts over time), a viscoelastic material may be used. The characteristic properties of the viscoelastic material may be selected based on expected impacts to the electronic device component.

21 Claims, 1 Drawing Sheet

(56) References Cited

U.S. PATENT DOCUMENTS

| | | | |
|---|---|---|---|
| 5,783,297 A | 7/1998 | Wise et al. | |
| 5,936,600 A | 8/1999 | Ohashi et al. | |
| 5,965,249 A | 10/1999 | Sutton et al. | |
| 5,982,617 A | 11/1999 | Haley et al. | |
| 6,085,878 A | 7/2000 | Araki et al. | |
| 6,154,360 A | 11/2000 | Kaczeus et al. | |
| 6,251,493 B1* | 6/2001 | Johnson et al. | 428/71 |
| 6,262,888 B1 | 7/2001 | Siedow et al. | |
| 6,288,489 B1 | 9/2001 | Isohata et al. | |
| 6,324,054 B1 | 11/2001 | Chee et al. | |
| 6,373,702 B2 | 4/2002 | Oishi et al. | |
| 6,524,692 B1 | 2/2003 | Rosen | |
| 6,596,976 B2 | 7/2003 | Lin et al. | |
| 6,603,620 B1 | 8/2003 | Berding | |
| 6,627,818 B2 | 9/2003 | Kamel et al. | |
| 6,633,481 B2 | 10/2003 | Pavol | |
| 6,647,328 B2 | 11/2003 | Walker | |
| 6,664,491 B2 | 12/2003 | Yanai et al. | |
| 6,665,192 B2 | 12/2003 | Wimberger et al. | |
| 6,701,529 B1* | 3/2004 | Rhoades et al. | 2/2.5 |
| 6,744,186 B2 | 6/2004 | Oishi et al. | |
| 6,809,916 B2 | 10/2004 | Nakata et al. | |
| 6,859,357 B2 | 2/2005 | Morimoto et al. | |
| 6,871,888 B2 | 3/2005 | Yamagiwa | |
| 6,924,996 B2 | 8/2005 | Sugawara | |
| 6,968,954 B2 | 11/2005 | Hsieh | |
| 7,009,835 B2 | 3/2006 | Desai et al. | |
| 7,059,182 B1 | 6/2006 | Ragner | |
| 7,094,094 B2 | 8/2006 | Zahnen et al. | |
| 7,113,351 B2 | 9/2006 | Hovanky | |
| 7,133,281 B2 | 11/2006 | Bae | |
| 7,167,360 B2 | 1/2007 | Inoue et al. | |
| 7,259,357 B2 | 8/2007 | Walker | |
| 7,260,885 B2 | 8/2007 | Albrecht et al. | |
| 7,369,345 B1 | 5/2008 | Li et al. | |
| 7,373,863 B2 | 5/2008 | O'Banion et al. | |
| 7,382,567 B2 | 6/2008 | Liao et al. | |
| 7,393,575 B2 | 7/2008 | Boss | |
| 7,450,332 B2 | 11/2008 | Pasolini et al. | |
| 7,463,436 B2 | 12/2008 | Takahashi et al. | |
| 7,477,469 B2 | 1/2009 | Cook et al. | |
| 7,492,544 B2 | 2/2009 | Jeansonne et al. | |
| 7,532,478 B2 | 5/2009 | Jeong | |
| 7,554,798 B2 | 6/2009 | Tanokuchi et al. | |
| 7,568,942 B1* | 8/2009 | Lannon et al. | 439/521 |
| 7,612,994 B2 | 11/2009 | Ulrich et al. | |
| 7,619,891 B2 | 11/2009 | Woo et al. | |
| 7,643,243 B2 | 1/2010 | Lee et al. | |
| 7,652,892 B2 | 1/2010 | Shiu et al. | |
| 7,660,107 B2 | 2/2010 | Leung | |
| 7,677,538 B2 | 3/2010 | Darnell et al. | |
| 7,684,183 B2 | 3/2010 | Mori et al. | |
| 7,760,289 B2 | 7/2010 | Nakanishi et al. | |
| 7,817,373 B2 | 10/2010 | Choi et al. | |
| 7,839,051 B2 | 11/2010 | Klinghult | |
| 7,855,892 B2* | 12/2010 | Lin | 361/730 |
| 8,075,981 B2 | 12/2011 | Pearce et al. | |
| 8,093,811 B2 | 1/2012 | Tanokuchi et al. | |
| 8,106,789 B2 | 1/2012 | Yang et al. | |
| 8,144,453 B2 | 3/2012 | Brown et al. | |
| 8,189,280 B2 | 5/2012 | Ollila et al. | |
| 8,190,015 B2 | 5/2012 | Lin et al. | |
| 8,240,777 B2 | 8/2012 | Heren et al. | |
| 8,248,777 B2 | 8/2012 | Prest | |
| 8,289,689 B2 | 10/2012 | Chen et al. | |
| 8,289,715 B2 | 10/2012 | Takahara | |
| 8,297,601 B2* | 10/2012 | Vito et al. | 267/140.11 |
| 8,305,744 B2 | 11/2012 | Shedletsky et al. | |
| 8,330,305 B2 | 12/2012 | Hart et al. | |
| 8,352,077 B2 | 1/2013 | Goswami et al. | |
| 8,411,432 B1 | 4/2013 | Zimlin et al. | |
| 8,446,475 B2 | 5/2013 | Topliss et al. | |
| 8,467,133 B2 | 6/2013 | Miller | |
| 8,564,424 B2 | 10/2013 | Evarts et al. | |
| 2003/0137859 A1* | 7/2003 | Sugawara | 365/51 |
| 2003/0168790 A1 | 9/2003 | Larson | 267/141 |
| 2004/0215966 A1* | 10/2004 | Elteto | 713/182 |
| 2005/0017396 A1 | 1/2005 | Pearce et al. | |
| 2006/0109581 A1 | 5/2006 | Lee et al. | |
| 2007/0091730 A1* | 4/2007 | Ting | 368/282 |
| 2007/0273643 A1* | 11/2007 | Erez et al. | 345/156 |
| 2008/0024972 A1 | 1/2008 | Yamaguchi | |
| 2008/0091309 A1 | 4/2008 | Walker | |
| 2008/0192124 A1 | 8/2008 | Nagasaki | |
| 2009/0179361 A1* | 7/2009 | Vito et al. | 267/140.11 |
| 2009/0181572 A1* | 7/2009 | Tracy et al. | 439/447 |
| 2009/0273480 A1 | 11/2009 | Mittleman et al. | |
| 2010/0149073 A1 | 6/2010 | Chaum et al. | |
| 2010/0162835 A1 | 7/2010 | Lee et al. | |
| 2010/0164152 A1 | 7/2010 | Li | |
| 2010/0272969 A1* | 10/2010 | Taylor | 428/196 |
| 2011/0228460 A1 | 9/2011 | Kim et al. | |
| 2011/0257765 A1 | 10/2011 | Evans et al. | |
| 2011/0310500 A1 | 12/2011 | Osaka et al. | |
| 2012/0212484 A1 | 8/2012 | Haddick et al. | |
| 2012/0212499 A1 | 8/2012 | Haddick et al. | |
| 2013/0063885 A1 | 3/2013 | Shedletsky et al. | |
| 2013/0073095 A1 | 3/2013 | King et al. | |
| 2013/0100591 A1 | 4/2013 | Montevirgen et al. | |
| 2013/0127980 A1 | 5/2013 | Haddick et al. | |
| 2013/0257582 A1 | 10/2013 | Rothkopf et al. | |
| 2013/0278631 A1 | 10/2013 | Border et al. | |
| 2013/0285490 A1 | 10/2013 | Rothkopf et al. | |
| 2014/0066122 A1 | 3/2014 | Shukla et al. | |

FOREIGN PATENT DOCUMENTS

| | | |
|---|---|---|
| GB | 1133198 | 11/1968 |
| JP | 2008067160 | 3/2008 |
| JP | 2009104407 | 5/2009 |
| JP | 2011099758 | 5/2011 |
| WO | WO2010/135421 | 11/2010 |

\* cited by examiner

VISCOELASTIC MATERIAL FOR SHOCK PROTECTION IN AN ELECTRONIC DEVICE

CROSS-REFERENCE TO RELATED APPLICATION

This application is a continuation of U.S. patent application Ser. No. 12/242,907, filed Sep. 30, 2008, which application claims priority from U.S. Provisional Patent Application No. 61/128,669, filed May 23, 2008, both of which are incorporated by reference as if fully disclosed herein.

BACKGROUND OF THE INVENTION

This invention relates to protecting electronic device components from shocks due to impacts on the electronic device housing.

Electronic devices are constructed using many different components, some of which may be fragile. For example, some electronic devices may include moving components that are particularly susceptible to damage when subject to impacts. Such components may include, for example, hard drives (e.g., rotating discs), input mechanisms (e.g., switches located inside the electronic device), or any other mechanical component operative to move within the electronic device.

To prevent damage to such components, elastic materials may be placed around the components to absorb at least a part of impacts. For example, an elastic sleeve may be placed around the periphery of an electronic device component such that the sleeve deflects upon impact, absorbing part of the energy transmitted to the electronic device component and reducing the force applied to the electronic device.

While using elastic materials (e.g., materials with low Young's modulus) may limit the strength of shock events on electronic device components, such materials are typically tailored to minimize a specific impact (e.g., a maximum drop while the component is not moving). While the material may prevent damage due to less significant impacts, if the component is subject to a lesser impact while it is more susceptible to damage, the elastic protection material may not be sufficient (e.g., the elastic material cannot reduce the force to an amount less than the critical force when the component is more susceptible). In addition, the amount of elastic material necessary to cushion an impact may be too large to be a useful approach in small form-factor electronic devices.

SUMMARY OF THE INVENTION

A system for protecting electronic device components from impacts by using a viscoelastic material is provided.

An electronic device component may be surrounded on all sides by material operative to absorb a shock to the electronic device component. The material may be distributed around the component using any suitable criteria, including for example based on analysis of the most likely impact orientations for different types of impacts (e.g., the orientation of the component when the electronic device is dropped from a low height, and the orientation of the component when the device is dropped from a larger height).

The material used to reduce shocks on the component may be selected for its viscoelastic properties. When a viscoelastic material is stressed (e.g., during an impact or shock event), the reaction and deformation of the material includes both a viscous response (e.g., the rate of deformation is related to the impact) and an elastic response (e.g., the material deforms immediately upon impact and returns to its prior configuration once the effect of the impact has dissipated). By carefully selecting the viscous and elastic properties of the material, the effect of shocks to electronic device components may be more effectively reduced for a wide variety of shocks (e.g., by maximizing the deformation of the material for a range of shock events).

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

Figure 1:
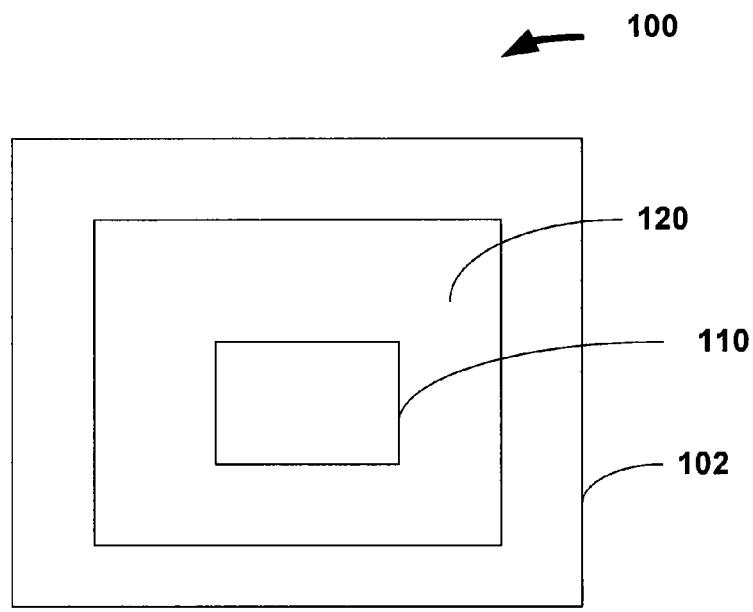
FIG. 1 is a schematic view of an electronic device component surrounded by a boundary element in accordance with one embodiment of the invention.

FIG. 1 is a schematic view of an electronic device component surrounded by a boundary element in accordance with one embodiment of the invention. Electronic device 100 may include housing 102 forming the outer cover of the device and component 110 placed inside the housing. In some embodiments, electronic device 100 may include more than one component 110, but for the sake of clarity, only one is shown in FIG. 1.

To reduce the effect of shocks on component 110, electronic device 100 may include boundary element 120 (e.g., a snubber material). Boundary element 120 may at least partially surround component 110 such that boundary element 120 creates a layer (e.g., sway space) between component 110 and housing 102. For example, boundary element 120 may include a shell into which component 110 may be placed and in which component 110 may move in at least one direction or dimension. When electronic device 100 is subject to a shock causing component 110 to be displaced toward housing 102 (or other components of electronic device 100), boundary element 120 may be operative to impact housing 102 and deform prior to component 110 reaching housing 102. By deforming, boundary element 120 may be operative to absorb energy of component 110 (e.g., kinetic energy) and lessen or eliminate the impact between component 110 and housing 102. In particular, boundary element 120 may deform to reduce the acceleration to which component 110 is subject, which in turn reduces the force to which component 110 is subject (e.g., F=ma).

Boundary element 120 may have any suitable geometry or thickness. For example, boundary element 120 may include a feature operative to deform to absorb an impact (e.g., a ridge or shell structure). Boundary element 120 may be placed over any suitable surface of component 110. For example, boundary element 120 may include a channel operative to receive the edges of component 110 such that upper, lower and side surfaces of the component are protected (e.g., a U-shaped wall placed around the periphery of component 110). The thickness of boundary element 120 may be selected based on physical or mechanical properties of the material used for boundary element 120, the geometry of boundary element 120 (e.g., boundary element 120 may include ridges or ribs operative to crush to absorb the impact), the amount and direction of the impact, or any other suitable criteria.

Any suitable material may be used for boundary element 120. In some embodiments, an elastic material may be used. For example, a material with a low Young's modulus (e.g., allowing extensive compressing for absorbing forces) may be used. When a force is applied to such a material, it may deform to absorb the energy and decrease the acceleration of a component placed in contact with the material. The lower the Young's modulus (e.g., the more elastic or spring-like) the material, however, the more material may be needed to deform to absorb the force. This may in turn require larger spaces to absorb force, and increase the size of the electronic device housing.

In some embodiments, a material that exhibits both elastic and viscous properties may be used. One type of material that exhibits both elastic and viscous properties is a viscoelastic material. These materials may be characterized by a time-dependent relationship between stress and strain (e.g., the amount of deformation changes over time for a constant stress). The viscoelastic material may have any suitable relation between stress and strain rate. For example, if stress is linearly proportional to the stress rate, the material may be characterized as a linear or Newtonian material. As another example, if stress is not linearly proportional to the stress rate, the material may be characterized as a non-linear or non-Newtonian material.

The response of viscoelastic materials may be predicted or calculated using a number of different approaches. For example, for linear viscoelastic materials, strain can be written as the sum of a stress component (e.g., due to a received force) and a creep component (e.g., due to re-arranging of molecules in the material). Other suitable approaches for modeling linear viscoelastic materials may include, for example, the Maxwell model, the Kelvin-Voigt model, the Standard Linear Sold model, or the Generalized Maxwell model. As another example, non-linear viscoelastic materials may be characterized by a complex dynamic modulus representing the relation between the oscillating stress and strain.

Using a viscoelastic material for damping may provide protection for an electronic device component from different types of impacts. For example, the coefficients of the viscoelastic material may be selected such that the strain is maximized for several types of impacts. In one such approach, the material may be selected such that the strain is large (e.g., the material deforms significantly, thus absorbing a large amount of energy) for a large impact (e.g. a drop of one meter), while the damping is substantial for a smaller impact that lasts longer (e.g., the user roughly places or pushes the electronic device on a hard surface, for example when synching the electronic device with a host device). This may be possible by selecting a material for which the elastic properties are dominant in the large impact scenario (e.g., a large force applied instantaneously to the material), while the viscous properties are dominant in the small impact scenario (e.g., a smaller force, applied over a period of time). When intermediate forces are applied to the material, both the elastic and viscous responses (e.g., elastic deformation and damping of the material) may enable the material to absorb the impact and reduce the shock to the component.

The stiffness or coefficients of a viscoelastic material may be selected based on a number of criteria. For example, given limited space available for a boundary element (e.g., boundary element 120), the stiffness of the material used (e.g., the relation between stress and strain rate) may be selected and tailored to optimize the force absorbed (e.g., the amount by which acceleration is reduced) for a particular impact event (e.g., a drop from a particular height). Because the viscoelastic material may include a non-linear relation between stress and strain rate, the stiffness of the material may further be tailored to provide optimized impact protection at other impact levels. For example, a non-linear viscoelastic material may be tailored to provide optimized protection for drops from 1.5 meters (e.g., a user's hand during use), 1 meter (e.g., from a table), and 0.5 meters (e.g., when a user accidentally drops and catches the device).

Figure 2:
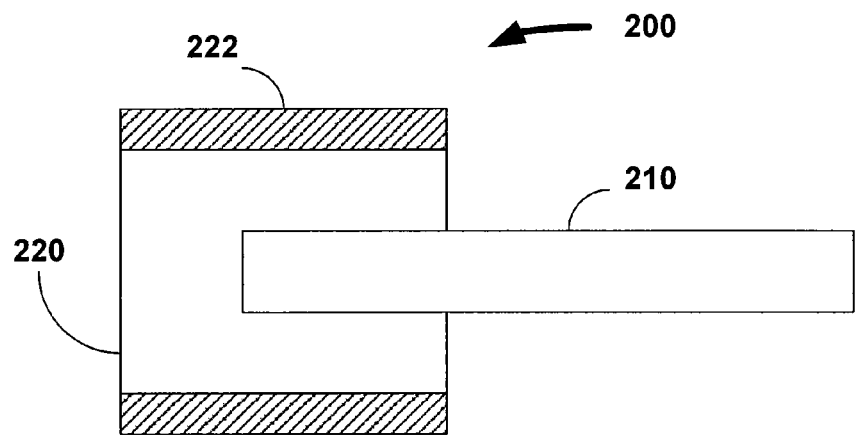
FIG. 2 is a cross-section of an illustrative boundary element in accordance with one embodiment of the invention.

Any suitable viscoelastic material may be used for boundary element 120. For example, amorphous polymers, semicrystalline polymers, biopolymers, bitumen material, or any other suitable viscoelastic material may be used. In some embodiments, the viscoelastic material may be one or more of these, and specifically tailored to maximize the reduction of impacts on the electronic device component. For example, boundary element 120 may include a combination of viscoelastic or non-viscoelastic materials. FIG. 2 is a cross-section of an illustrative boundary element in accordance with one embodiment of the invention. Boundary element 200 may be coupled to the periphery of electronic device component 210. Boundary element 200 may include several layers formed by different materials. For example, boundary element 200 may include first layer 220, located adjacent to component 210, and second layer 222, placed adjacent to the outer surface of first layer 210. Second layer 220 may be placed over any suitable surface of first layer 210, including for example over a top, bottom or side surface, or combinations of these. In some embodiments, several different materials may be placed over different surfaces of first layer 210 to provide different levels of shock absorption (e.g., based on the geometry of the component or of the device, or on expected impact patterns). The materials used in boundary element 210 may include elastic, plastic or viscoelastic materials, or combinations of these.

The above described embodiments of the present invention are presented for purposes of illustration and not of limitation, and the present invention is limited only by the following claims.

What is claimed is:

1. An electronic device comprising:
a housing;
a component positioned within the housing; and
a boundary element comprising a plurality of layers positioned within the housing adjacent to the component, each of the plurality of layers providing a shock response characteristic different from that of other layers; wherein
the combination of the plurality of layers reduces the effects of shock events of varying magnitude on the component; and
the component positioned adjacent the boundary element is operative to move in at least one direction within the housing during the shock events.

2. The electronic device of claim 1, wherein the plurality of layers of the boundary element includes at least one of:
a viscoelastic layer;
an elastic layer; or
a plastic layer.

3. The electronic device of claim 1, wherein the plurality of layers of the boundary element further comprises:
a first layer; and
a second layer, distinct from the first layer.

4. The electronic device of claim 3, wherein the first layer of the plurality of layers of the boundary element is coupled to a portion of a surface of the component.

5. The electronic device of claim 4, wherein the second layer of the plurality of layers of the boundary element is coupled to the first layer the boundary element opposite to the portion of the surface of the component.

6. The electronic device of claim 1, wherein at least one of the plurality of layers of the boundary element includes one of:

a ridge structure adapted to reduce the effects of shock events of a predetermined magnitude on the component by deforming; or a plurality of ribs adapted to reduce the effects of shock events of the predetermined magnitude on the component by crushing.

7. The electronic device of claim 3, wherein the first layer of the plurality of layers of the boundary element is in contact with a surface of the component.

8. The electronic device of claim 7, wherein the first layer of the plurality of layers of the boundary element completely surrounds the component.

9. The electronic device of claim 8, wherein the second layer of the plurality of layers of the boundary element is concentric with the first layer of the boundary element.

10. The electronic device of claim 7, wherein the second layer of the plurality of layers of the boundary element is coupled to at least a portion of the first layer of the plurality of layers of the boundary element opposite to the surface of the component.

11. The electronic device of claim 10, wherein the second layer of the plurality of layers is coupled to at least one of:
a top surface of the first layer;
a bottom surface of the first layer; and
a side surface of the first layer.

12. The electronic device of claim 1, wherein the plurality of layers of the boundary element reduce effects of shock events on the component due to impacts on the housing of different intensities from at least two directions.

13. An electronic device comprising:
a housing;
a component positioned within the housing; and
a boundary element positioned within the housing adjacent to the component, the boundary element having a shape adapted to reduce effects of shock events of varying magnitude on the component; wherein
the component is operative to move in at least one direction within the housing during the shock events.

14. The electronic device of claim 13, wherein the boundary element comprises:
a viscoelastic first layer; and
an elastic second layer coupled to the viscoelastic first layer.

15. The electronic device of claim 13, wherein the boundary element is coupled to at least a portion of a surface of the component.

16. The electronic device of claim 13, wherein the boundary element includes a channel adapted to reduce the effects of shock events of a predetermined magnitude on the component by receiving at least edge of the component.

17. The electronic device of claim 13, wherein the boundary element is in contact with at least one of:
an upper surface of the component;
a lower surface of the component; and
at least one side surface of the component.

18. The electronic device of claim 17, wherein the boundary element includes one of:
a shell structure surrounding the component; or
a U-shaped wall surrounding an edge portion of the component.

19. An electronic device comprising:
a component positioned within a housing; and
a boundary element comprising two or more layers positioned adjacent to the component, each of the two or more layers providing a shock response characteristic different from that of other layers, and at least one of the two or more layers of the boundary element comprises one of:
a ridge structure adapted to reduce the effects of shock events of a predetermined magnitude on the component by deforming; or
a group of ribs adapted to reduce the effects of shock events of the predetermined magnitude on the component by crushing; wherein
the combination of the two or more layers reduces the effects of shock events of varying magnitude on the component; and
the component positioned adjacent the boundary element is operative to move in at least one direction within the housing during the shock events.

20. The electronic device of claim 19, wherein the at least one of the two or more layers of the boundary element comprising the ridge structure or the group of ribs is formed from an elastic material.

21. The electronic device of claim 19, wherein each of the two or more layers of the boundary element are formed from distinct materials.

* * * * *